United States Patent [19]

Brown et al.

[11] 4,090,091
[45] May 16, 1978

[54] HOUSING AND CONTROL CIRCUIT ASSEMBLY WITH SENSING ELEMENT

[75] Inventors: Dennis L. Brown, Bradenton; Gordon E. Gee; Michael A. Wilson, both of Sarasota, all of Fla.

[73] Assignee: Electro Corporation, Sarasota, Fla.

[21] Appl. No.: 660,255

[22] Filed: Mar. 17, 1976

[51] Int. Cl.² ............................................. H01H 36/00
[52] U.S. Cl. ..................................... 307/116; 361/179; 340/258 C; 328/5; 174/52 R
[58] Field of Search ..................... 307/116; 340/258 R, 340/258 A, 258 B, 258 C, 258 D; 328/5; 361/179, 180, 181, 380, 381, 386, 389; 200/DIG. 1; 174/16 R, 16 HS, 52 R; 116/124 L

[56] References Cited

U.S. PATENT DOCUMENTS

| | | | |
|---|---|---|---|
| 2,762,970 | 9/1956 | Balduman | 340/258 R |
| 3,197,658 | 7/1965 | Byrnes et al. | 307/116 |
| 3,292,052 | 12/1966 | Richter et al. | 307/116 |
| 3,473,110 | 10/1969 | Hardin et al | 340/258 R |

Primary Examiner—Robert K. Schaefer
Assistant Examiner—Morris Ginsburg
Attorney, Agent, or Firm—Wegner, Stellman, McCord, Wiles & Wood

[57] ABSTRACT

An electronic limit switch assembly including a sensor and a switching circuit controlled thereby contained in separate molded plastic housings. The sensor housing and the switching circuit housing are secured together with respective mating walls thereof in abutment and electrically coupled by leads protruding through the mating walls and protectively contained in a cavity in the mating wall of the sensor housing. A sensing coil is mountable for side sensing between a side wall of the sensor housing and an interior wall spaced therefrom defining a part of the cavity for side sensing and is also mountable for end sensing against an end wall opposite the mating wall and underlying the interior wall. Elements of the switching circuit are mounted on a printed circuit board and elongate conductive members secured to the board and connected with elements of the circuit protrude through mating holes in the top of the switching housing which function as terminal posts, heat sinks and circuit board mounts. A bulb of an indicator lamp is supported above the circuit board and adjacent a viewing port in the housing top by elongate rigid leads wave-soldered to the board with the other circuit elements. A cover overlying the top is removed for access to screw connectors at the ends of the conductive members. A guide wall overlying the circuit board and underlying the cover extends between a lead passageway at the end of the housing connectable with standard wiring conduit. The guide wall, upon being engaged by the end of a lead inserted through the passageway, guides it to the connectors.

18 Claims, 24 Drawing Figures

HOUSING AND CONTROL CIRCUIT ASSEMBLY WITH SENSING ELEMENT

BACKGROUND OF THE INVENTION

This invention relates to a circuit mounting arrangement and a housing assembly for a pair of complementary circuits such as a sensing element and switching circuit controlled thereby of a metal proximity sensing limit switch.

Electrically powered machinery is often controlled by limit switches which control the application of power to the machinary in accordance with the position of a moving part thereof. In numerous applications, food processing machinery for instance, the machinery is subjected to frequent steam or water cleaning or the like. In other applications, the machinery, and thus the limit switches associated therewith, are subjected to other fluids harmful to the limit switches and the wiring connected therewith. Accordingly, safe and trouble-free operation frequently requires that the power-carrying wiring connected between the limit switch and the source of power and the load be contained within wiring conduit and the limit switch circuitry itself be contained within a protective housing joined with the conduit.

Despite the existence of electronic limit switches which are free of numerous disadvantages such as contact corrosion and mechanical wear of mechanical limit switches, mechanical limit switches are still widely employed. An important factor discouraging owners of machinery from replacing mechanical limit switches with electronic limit switches is the cost of doing so.

The cost of replacement includes the cost of labor for doing the replacement work as well as the purchase price of the electronic limit switch. Factors contributing to the cost of a limit switch assembly, which includes a housing in addition to the controlled switching circuit and sensing element, are the cost of manufacturing the housing, the labor cost in assembling the circuit with the housing, the cost of mounting elements necessary to secure the circuit to the housing and to make electrical connection with external circuitry and the factors which prevent obtainment of economies of scale.

The designs of known electronic limit switch assemblies have prevented the minimization of both the cost of the switch assemblies themselves and the cost of labor necessary for replacement.

SUMMARY OF THE INVENTION

The general object of the present invention is to provide a housing assembly for a pair of complementary circuits such as a sensing coil and a switching circuit controlled thereby of a metal proximity sensing limit switch with features which minimize the cost of manufacturing and installation.

In keeping with this objective, a housing for a controlled switching circuit of a metal proximity sensing limit switch is provided with a lead passageway connectable with conventional wiring conduit and a guide wall extending from the lead passageway to a connector terminal of the circuit snugly fitted through a hole in the top of a housing and underlying a removable cover to simplify installation. The end of the conduit is fitted into the lead passageway, and leads protruding from the end of the conduit upon engaging the guide wall are guided thereby toward the terminal connector. The cover is removed to make the connection. Remounting of the cover after the connection is made seals the terminals and leads connected therewith against moisture, oil, or the like.

The switching circuit contained within the housing is mounted to a circuit board. Space utilization to maximized and thereby housing size and the cost of materials therefor minimized by arranging low profile circuit elements of the circuit to enable mounting the board within the housing with those elements underlying the guide wall.

In accordance with another aspect of the invention, the circuit contained within the housing is mounted to a circuit board, and an elongate conductive member secured at one end to the circuit board and at an opposite end to the top of the housing functions both as a terminal post and as means for mounting the circuit board to the housing. In the preferred embodiment, a high power switching element of the circuit is mounted to the terminal conductive member which thereby also functions as a heat sink.

Simplifying assembly, all but the bottom wall of the housing is integrally formed from molded plastic or the like. During assembly, the circuit board is inserted into the housing through an open bottom of the molded plastic part and the elongate conductive member pushed through a mating hole in the top. This holds the circuit board within the housing in a proper position while the open bottom is sealed with a suitable potting material. Insertion of the elongate conductive member into the mating hole also properly aligns an indicator light of the circuit with a viewing port in the top of the housing.

Satisfying further the objective of the present invention is the provision of a separate housing for a sensing coil connectable with the switching circuit housing and having means for holding the sensing coil against an end wall thereof for end sensing and against a side wall thereof for side sensing. The housing has an interior wall spaced from the external side wall thereof to hold the sensing element against the one side wall and an end sufficiently spaced from the end wall to allow mounting of the sensing element thereagainst. The additional cost of providing two housings, one for end sensing and one for side sensing, is eliminated.

In keeping with yet another aspect of the invention, at least one of a pair of housings respectively enclosing a pair of cooperating circuits has a cavity in a mating wall thereof for mating engagement with a wall of the other housing when the two housings are secured together. One of a pair of conductors connectable with each other and respectively connected with the pair of circuits protrudes from the cavity. One of the connectors is flexible and elongate to enable separation of the mating wall to make the connection. After the connection is made, the flexible conductor is folded into and protectively contained within the cavity when the mating walls of the two housings are secured together. When the sensor is mounted against one of the side walls of its housing, the flexibility of the conductor permits securing the housings together with the sensing coil wall in alignment with different selected ones of the side walls of the other housing, thus greatly increasing the versatility of the assembly.

Another advantageous feature of the sensor housing is that the interior wall, in addition to holding the sensing element against the side wall, defines, in part, the cavity which protectively houses the flexible conductors.

A further advantageous feature of the invention satisfying the general objective is that the sensing circuit includes an indicator lamp with a bulb and elongate leads connected therewith. The leads support the bulb in an upright position above the other circuit elements and adjacent the top of the housing in alignment with a viewing port therefor. This enables the indicator lamp to be wave-soldered to a printed circuit board in one operation with the other circuit elements.

The foregoing advantageous features will be discussed more thoroughly and further advantageous features of the invention will be made apparent in the description of the preferred embodiment.

DESCRIPTION OF THE DRAWING

The description of the preferred embodiment will be given with reference to the several views of the drawing in which.

DESCRIPTION OF THE PREFERRED EMBODIMENT

Figures 1, 2:
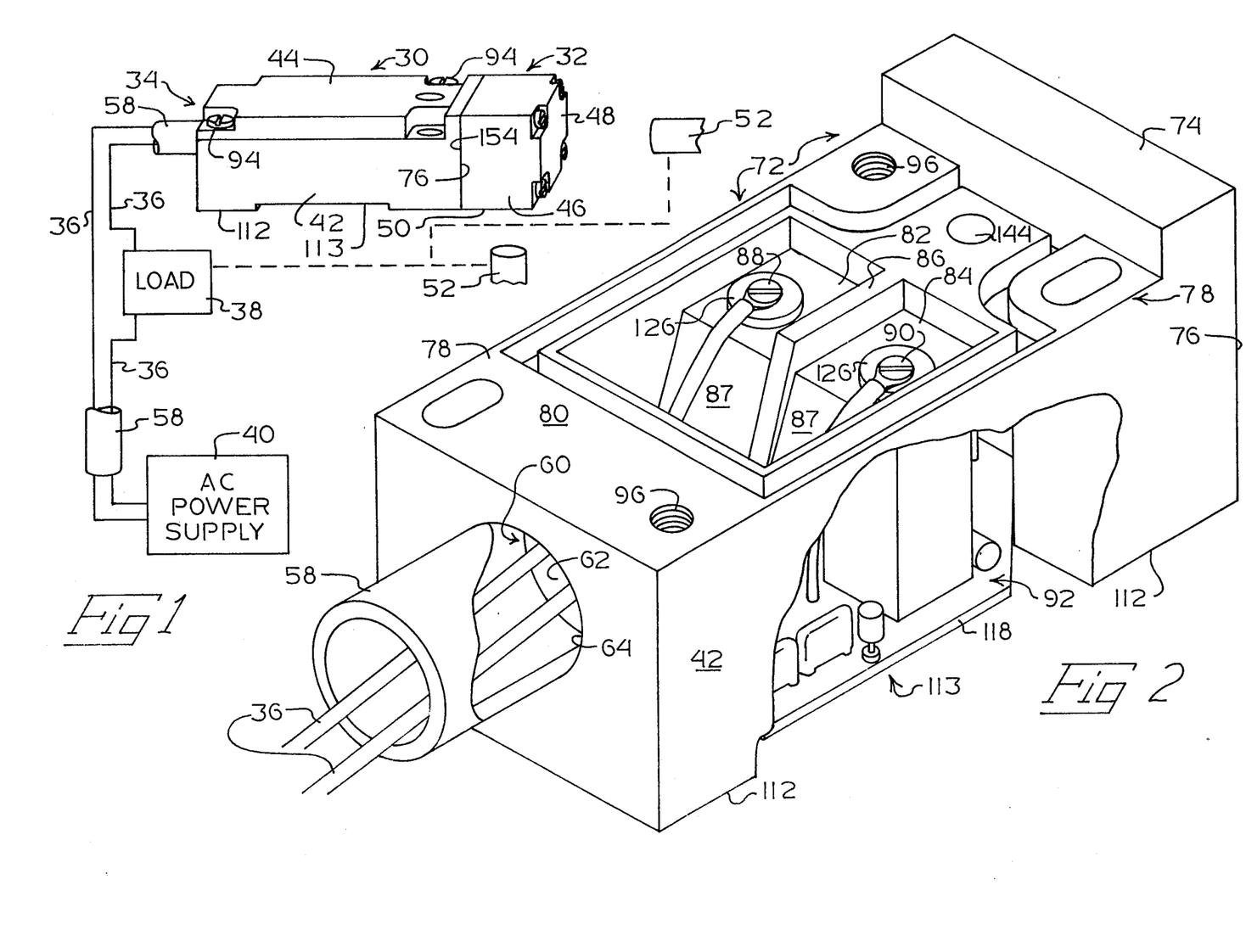
FIG. 1 is a perspective view of the preferred embodiment of the circuit housing assembly for the complementary circuits of a metal proximity sensing limit switch and a schematic illustration of the manner in which the switch is connected with a source of power and a load and its positional relationship with respect to a conductive target movable in accordance with the application of power to the load.
FIG. 2 is an enlarged perspective view of a housing body of the controlled switching circuit with parts broken away to illustrate the circuit board and the manner in which the body is connected with a piece of wiring conduit.

Referring now to FIG. 1, one preferred embodiment of the circuit assembly of the present invention is seen to include a switching circuit assembly 30 and a sensing head assembly 32. The switching circuit assembly includes a housing 34 for protectively enclosing a controlled switching circuit (not shown in FIG. 1) connected through leads 36 with a load 38 and source of AC power 40. Housing 34 includes a body 42 within which the switching circuitry is contained and a removable cover 44. The head assembly 32 includes a sensor housing 46 protectively enclosing a sensing circuit (not shown in FIG. 1) connected with the switching circuit.

The switching circuit functions to control the application of power to load 38 from power source 40 in accordance with signals developed by the sensing circuit. As will be explained in more detail, the sensing circuit includes a coil mounted adjacent an end 48 of housing 46 for end sensing or mounted against a side 50 of housing 46 for side sensing. When the coil is mounted for end sensing, signals are developed therewithin in response to proximity of a conductive target 52 to end 48. When the coil is mounted for side sensing, signals are developed thereby in response to proximity of the target 52 to side 50.

Referring to FIG. 2, leads 36 are often heavy gauge wire adapted to carry several amperes of current at 115 volts AC. Accordingly, they are contained within conventional wiring conduit 58. Referring also to FIGS. 3, 4, 5 and 8, body 42 has a lead passageway 60 defined by a pair of aligned cylindrical holes 62 and 64. Hold 64 is threaded and opens through a back side 68 of body 42 for threaded connection with conduit 58. The diameter of hole 62 is less than that of hole 64 and is approximately equal to the inside diameter of conduit 58 to provide a smooth surface transition therebetween which facilitates easy insertion of leads 36. The difference in diameters also results in a shoulder 69 between holes 62 and 64 for seating a resilient washer 70, FIG. 4. If desired, the washer 70 is compressed between the end of conduit 58 and shoulder 69 to make a moisture-proof connection between the housing body 42 and the conduit 58. Another advantage resulting from the provision of reduced diameter hole 62 is that a greater amount of space thereunder for circuit elements is provided than if the larger diameter threaded hole 64 extended the entire length of lead passageway 60.

Body 42 has a top 72 with a raised section 74 adjacent an end wall 76 connectable with head assembly 32 and an elongate open section 78 underlying removable cover 44. Section 78 has a top surface 80 with a pair of terminal surfaces 82 and 84 recessed therein and separated by a divider wall 86. A pair of screw connectors 88 and 90 are accessible at surfaces 82 and 84 for connecting leads 36 with the switching circuit 92 within a cavity 93 in body 42.

When the conduit 58 is screwed into the threaded hole 64 of lead passageway 60, the ends of leads 36 protruding therefrom engage a guide wall 87 which is slanted upwardly from the end of hole 62 to terminal surfaces 82 and 84. Guide wall 87, upon being engaged by the ends of leads 36, cammingly guides them upward toward screw connectors 88 and 90, and the mere action of connecting body 42 with conduit 58 thereby results in the proper positioning of leads 36 for easy connection with the circuit. A guide wall opening 89 provides access to the guide wall 87 through top surface 80 so that the leads 36 may be grasped thereat to facilitate connection.

Referring also to FIGS. 9—13, after connection has been made, the removable cover 44 is secured to section 78 by means of screws 94, FIG. 1, extending through holes 95 in cover 44 screwed into threaded holes 96 at diagonally opposite corners of top section 78. Surrounding the guide wall opening 89 and the connector surfaces 82 and 84 is a groove 98 within which a downwardly extending mating wall 100 on an underside 102 of removable cover 44 fits when the underside 102 is in flush engagement with the top surface 80. A gasket (not shown) is placed into the groove 98. Insertion of sealing wall 100 into groove 98 and pressure thereof against the gasket provides a waterproof seal around the guide wall opening 89 and terminal surfaces 82 and 84. The insertion of sealing wall 100 into groove 98 also properly aligns holes 95 of removable cover 44 with tapped holes 96.

Figure 3:
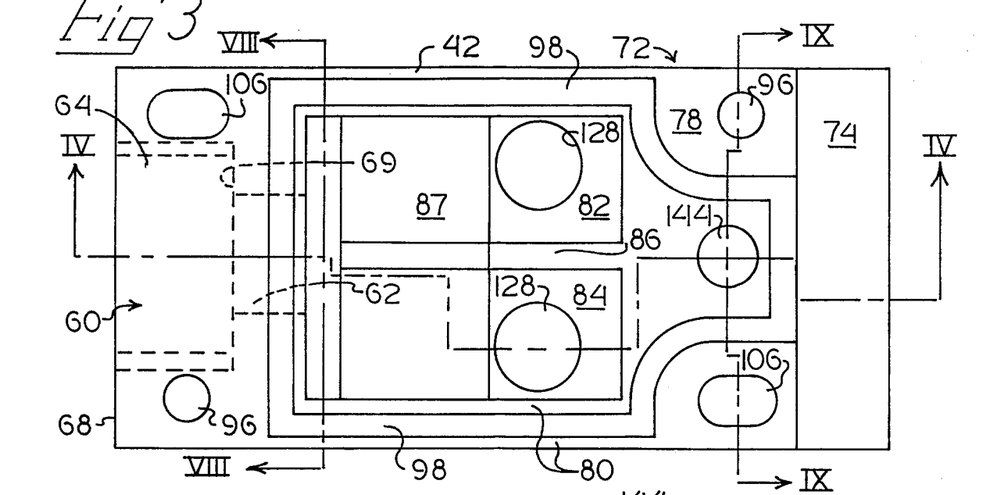
FIG. 3 is a top view of the switching circuit housing body of FIG. 2.
Figure 4:
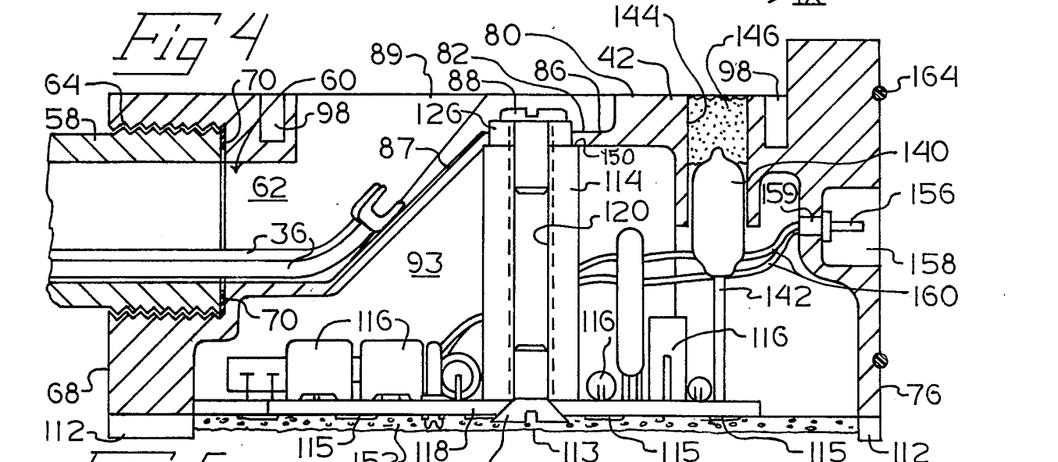
FIG. 4 is a sectional side view of the switching circuit housing body taken approximately along line IV—IV of FIG. 3.
Figure 5:
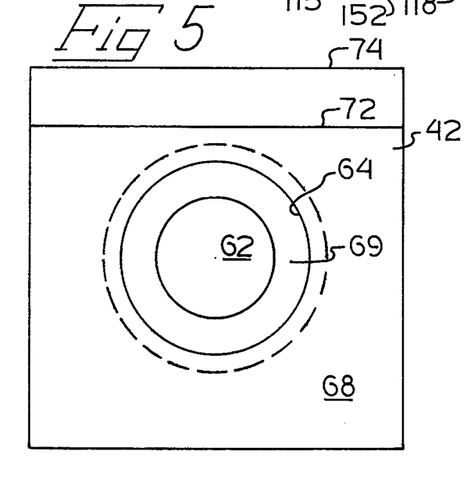
FIG. 5 is a view of the end of the switching circuit housing body connectable with wiring conduit.
Figure 9:
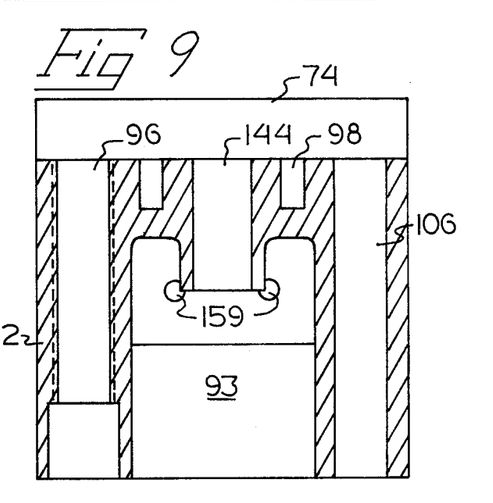
FIG. 9 is a vertical sectional view through the switching circuit housing body taken approximately along line IX—IX of FIG. 3.

In some instances, the body 42 may be supported in a selected position solely by conduit 58. However, as seen in FIG. 3, mounting holes 106 are provided at diagonally opposed corners of the housing for receipt of bolts or screws to mount the housing on a support surface. The mounting holes 106 are elongate slots to permit longitudinal positional adjustment, and, as best seen in FIG. 9, extend from the top to the bottom of the housing through a portion thereof spaced from the cavity 93 containing circuit 92. The removable cover 44 has recessed corners 111 whereby the mounting bolts extend only through the body 42 so that the cover may be removed without dismounting the body 42 and vice versa. As seen in FIGS. 1, 2 and 4, legs 112 are provided to support the central portion of a bottom 113 of body 42 above a support surface to which the body 42 is mounted to allow for the cooling circulation of air therebeneath.

Referring to FIGS. 4, 15, 16 and 17, another important aspect of the present invention is the provision of a pair of elongate conductive members 114 which function both as terminal posts and circuit board mounting posts. The switching circuit 92 includes a plurality of circuit elements 116 mounted to a circuit board 118 and electrically interconnected by means of conduction paths 115 printed on circuit board 118. The circuit elements 116 having a low profile are situated beneath hole 62 of lead passageway 60 and beneath guide wall 87 to maximize space utilization. Each of the elongate conductive members has a tapped hole 120 extending therethrough. The bottom end of each member 114 is secured to the top surface of the circuit board 118 by means of a screw 122 extending through the board 118 and tightly screwed into hole 120. The head of the screw also makes electrical connection with selected ones of circuit elements 116 through contact with printed conduction paths 115 on the underside of board 118. A boss 126 at the top end of each member 114 is snugly fitted through an associated one of holes 128 in terminal top surfaces 82 and 84 of body 42. Bosses 126 are held within holes 128 partially by a friction fit therewith and partially by an adhesive (not shown). The adhesive also functions as a seal between the hole and the boss. Screws 88 and 90 are screwed into the tapped holes 120 of the conductive members 114 associated therewith to make electrical connection between the wires 36 and the conductive members.

Figure 15:
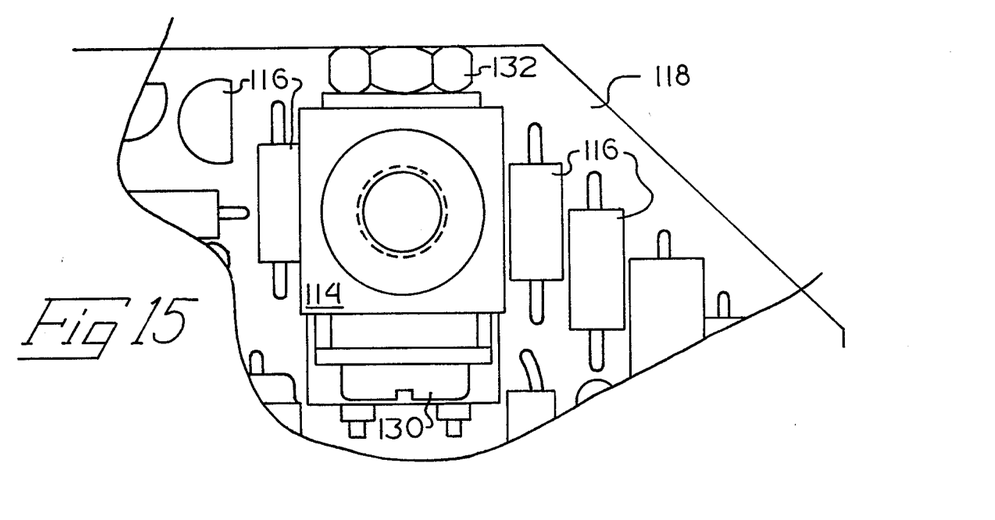
FIG. 15 is an enlarged plan view of a portion of the circuit board shown in FIG. 2 and elements of the switching circuit, and particularly illustrating a conductive member and its relationship with the elements of the circuit.
Figure 16:
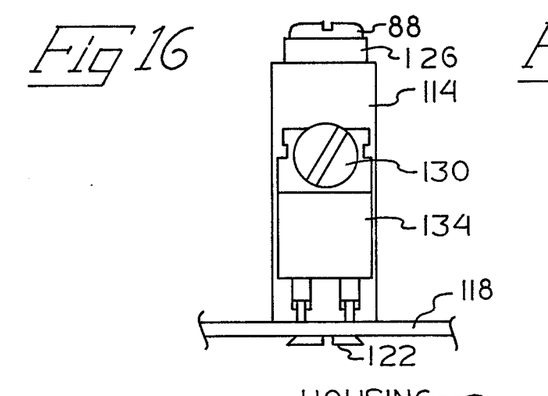
FIG. 16 is a front view of the terminal posts and switching element.
Figure 17:
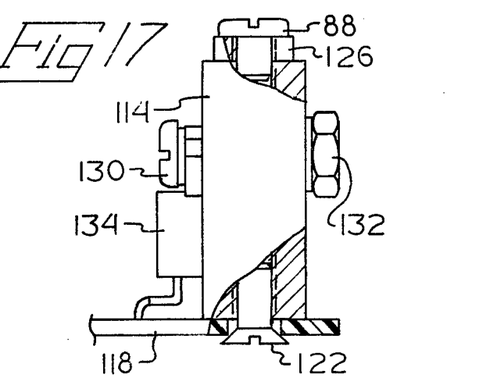
FIG. 17 is a side view of the terminal post with parts thereof in section to illustrate the manner of connection thereof with the circuit board.
Figure 18:
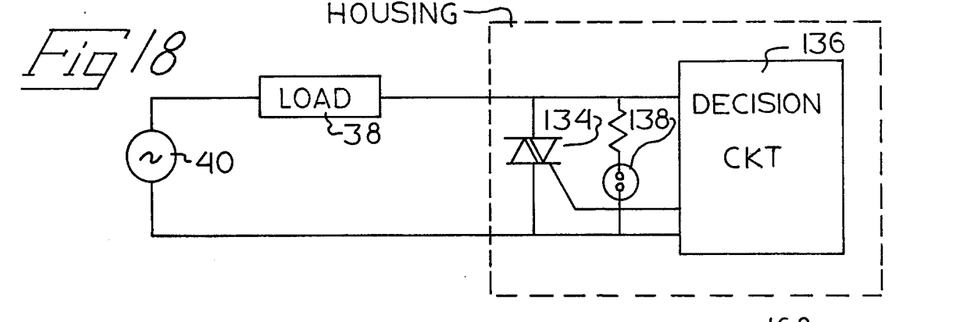
FIG. 18 is a simplified circuit schematic of the limit switch illustrating the circuit relationship between the switching element thereof and an indicator lamp.

One of the conductive members 114 also functions as a heat sink. As best seen in FIGS. 15, 16 and 17, the elongate conductive member extending through hole 128 of surface 82 has mounted to the side thereof by means of a screw 130 and nut 132 an active circuit element 134. As schematically illustrated in FIG. 18, element 134 switches AC power to the load 38 and is therefore subject to heating during operation of the circuit. Because of the intimate physical contact of circuit element 134, the elongate conductive member 114 conducts a heat away therefrom and to the boss 126 accessible at the top of body 44. Heat is also radiated from the side surfaces of conductive member 114 through the circuit-containing cavity 93.

Figure 10:
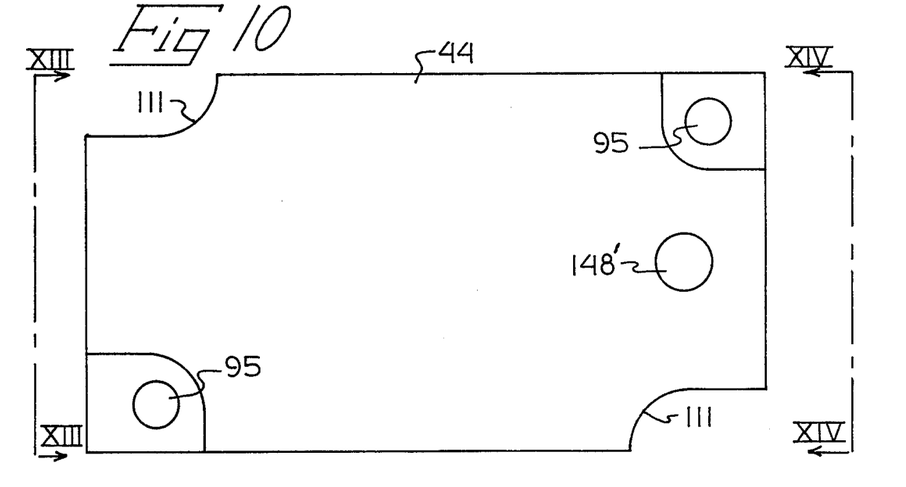
FIG. 10 is a plan view of the cover of the switching circuit housing shown in FIG. 1.
Figure 11:
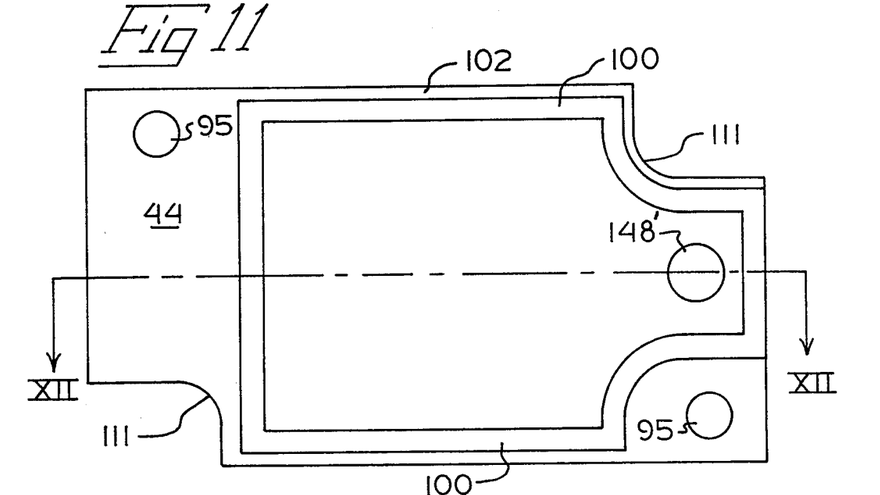
FIG. 11 is a bottom view of the switching circuit housing cover.
Figure 12:
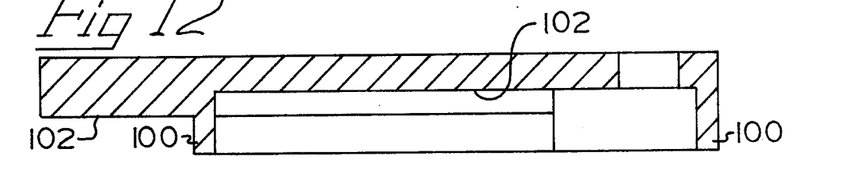
FIG. 12 is a vertical sectional view of the switching circuit housing cover taken substantially along section line XII—XII of FIG. 11.
Figure 13:
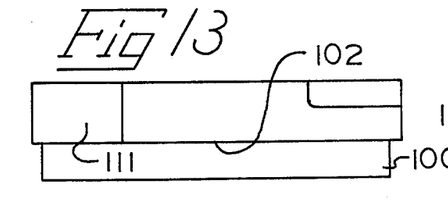
FIG. 13 is an end view of the cover as viewed from line XIII—XIII of FIG. 10.
Figure 14:
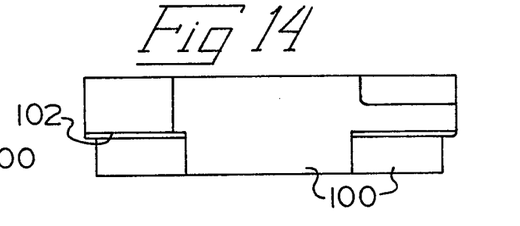
FIG. 14 is an end view of the cover as viewed from line XIV—XIV of FIG. 10.

Referring particularly to FIG. 18, the switching circuitry includes, in addition to circuit element 134, a decision circuit 136 and a neon indicator lamp 138. The decision circuit 136 may be of the type shown in U.S. Pat. Re. No. 24,779 of Elam, which operates on the basis of eddy current loss in sensing element coil upon proximity thereto of a conductive target. The neon indicator lamp 138 lights whenever element 134 assumes a nonconductive state to provide an indication that power is not being applied to the load 38. As seen in FIG. 4, the neon lamp 138 includes a bulb 140 and a pair of elongate leads 142 (only one shown). Body 42 has a viewing port 144 extending through top 80 which is sealed with a translucent potting material 146 to maintain the integrity of the protective housing. As seen in FIGS. 10 and 11, removable cover 44 has a hole 148' aligned with viewing port 144 so that the light from indicator lamp 138 may be seen therethrough.

Unlike known circuits having indicator lamps, the lamp 138 is not mounted to the body 42 and connected through highly flexible leads to the associated circuitry. Rather, the elongate leads 142 protrude through board 118 and are secured thereto and connected with the printed circuit paths on the underside thereof by solder. The leads 142 are relatively rigid and the bulb 140 is supported above circuit board 118 solely by elongate leads 142, and extends into and is loosely held against lateral movement by viewing port 144. The fact that the lamp 138 is not mounted to the housing, but rather is mounted to board 118, enables wave-soldering it to the board in a single process with the other circuit elements 116.

Figure 7:
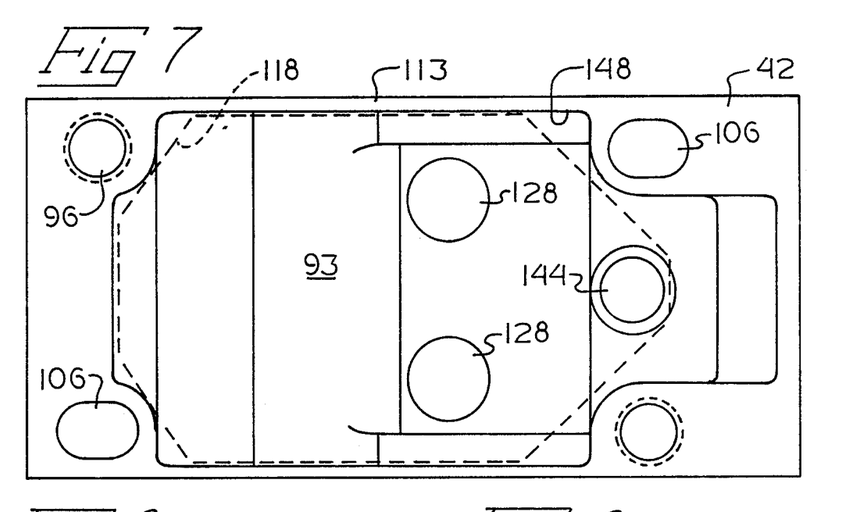
FIG. 7 is a bottom view of the switching circuit housing prior to the addition of potting material sealing closed the open bottom thereof.
Figure 8:
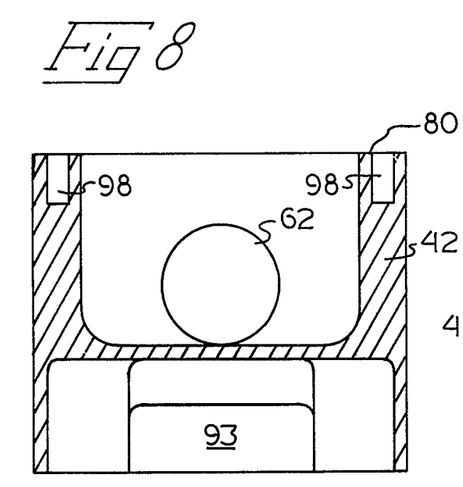
FIG. 8 is a vertical sectional view of the switching circuit housing body taken approximately along line VIII—VIII of FIG. 3.

As best seen in FIG. 7, the bottom 113 of housing 42 has an opening 148 substantially coextensive with cavity 93. During assembly, the circuit board 118 is fitted through opening 148 into cavity 93. The bulb 140 is inserted into port 144 and the bosses 126 of conductive members 114 are pushed through the mating holes 128. A shoulder 150 between bosses 126 and the underlying portions of each of the conductive members 114 prevents the members 114 from being pushed through holes 128 farther than desired. When further insertion of bosses 126 into holes 128 is stopped by shoulders 150, the circuit board 118 is properly positioned above the bottom 113 of housing 42 to seal closed opening 148. The fitting of bosses 126 into holes 128 also functions to vertically position lamp 138 within viewing port 144 and to align the elongate axis of board 118 with the elongate axis of the housing. A layer of potting material 152, FIG. 4, such as epoxy cement, is poured over the underside of board 118 to fill hole 148 and seal closed cavity 93.

Figure 6:
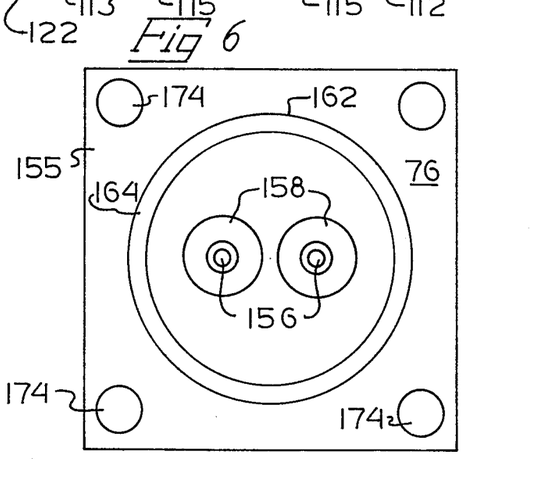
FIG. 6 is a view of the end of the switching circuit housing body connectable with the sensing coil housing.

Referring to FIG. 1, the front end wall 76 of body 42 mates with a back wall 154 of head assembly housing 46 opposite end wall 48 thereof. As seen in FIGS. 4, 6 and 9, wall 76 carries a pair of male connector pins 156 contained within a pair of connector cavities 158 which provide a protective wall around pins 156. The pins 156 extend through holes 159 in wall 76 and into the circuit-containing cavity 93 and are connected through a pair of leads 160 to inputs of the switching circuit 92. During assembly, the leads 160 are threaded through holes 159 and the pins 156 are then pressed through holes 159. The leads 160 are of sufficient length to permit connection with the circuitry of circuit board 118 prior to insertion thereof into body 42.

Contained within end mating wall 76 is an annular groove 162 within which is seated an O-ring 164. The O-ring 164 protrudes from wall 76 and is pressed against the mating back wall 154 of the sensing head housing 46 when the two housings are secured together to provide a moisture and oil-type seal around the male connector pins 156.

Referring to FIGS. 19–24, the back wall 154 of the sensing head housing 46 is secured to three side walls 168 and one side wall 50, all integrally formed with the end wall 48. Back wall 154 mates with end wall 76 of body 42 and is pressed against the O-ring 164 when the two housings are secured together by means of screws 170, FIG. 24, extending through holes 172 in the four corners of housing 46 and screwed into tapped holes 174 in end wall 76, FIG. 6. Other walls 176 and a part of a wall 177 define a cavity 178 in back wall 154 extending toward end wall 48. A pair of elongate, flexible leads 180 protrude through a hole 182 in a bottom one of the cavity-defining walls 176 and are connected with a capacitor 184 and the ends of a coil 186 of the sensing circuit at the interior of housing 46. The other ends of elongate flexible leads 180 carry female connectors 183 for mating connection with male connector pins 156. Leads 180 are of sufficient length so that connection may be easily made between female connectors 183 and male connector pin 156 while the housings 34 and 46 are separated. After connection is made, the elongate leads 180 are folded within cavity 178 and the housings are secured together as described.

Figures 19, 20:
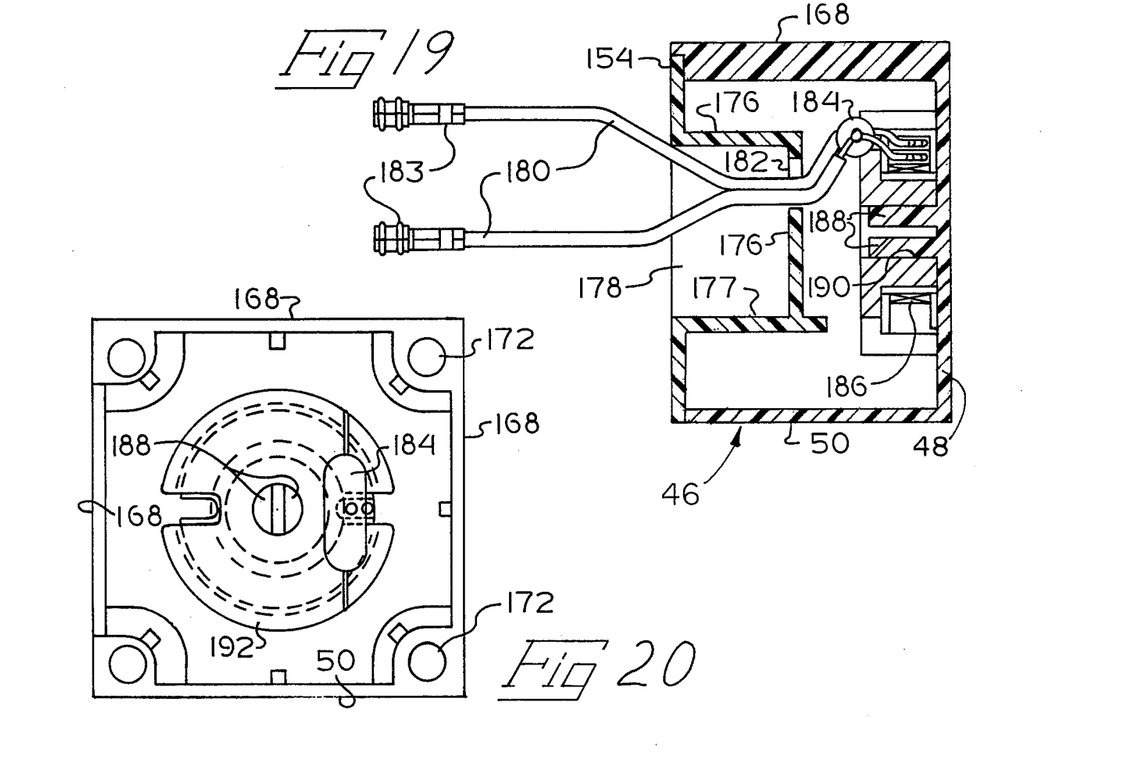
FIG. 19 is a sectional view of the sensor housing with a sensing coil mounted therewithin for end sensing.
FIG. 20 is an end view of the sensor housing rotated 90° clockwise from FIG. 19, with the back mating wall thereof removed and the sensing coil mounted therewithin for end sensing.

As best seen in FIGS. 19 and 20, the end wall 48 includes a pair of spaced tabs 188 at the interior thereof for mounting the coil 186 for end sensing. The tabs 188 snugly fit into an axial hole 190 of a spool 192 around which coil 186 is wound and resiliently bear thereagainst to frictionally hold the spool 192. In this end sensing position, the coil 186 lies between the end of wall 177 and end wall 48. The end of wall 177 is sufficiently spaced from end wall 48 to allow mounting of the sensing coil thereagainst.

Figure 21:
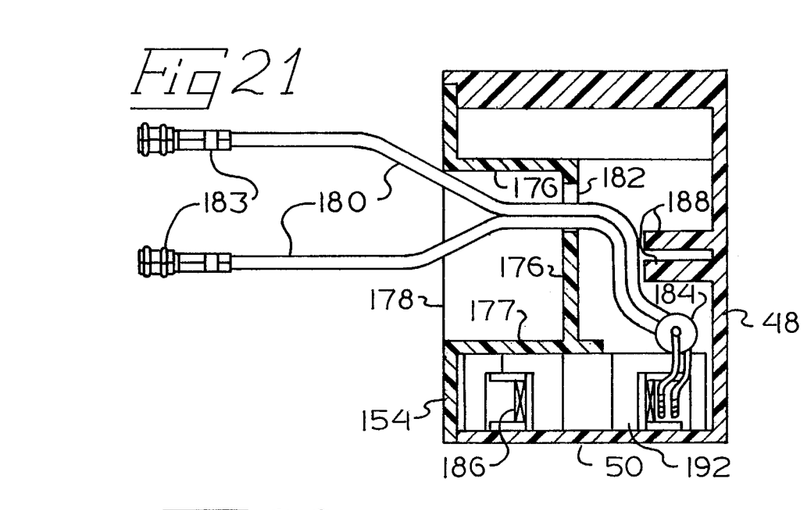
FIG. 21 is a vertical sectional view of the sensing coil housing with a sensing coil mounted therewithin for side sensing.
Figure 22:
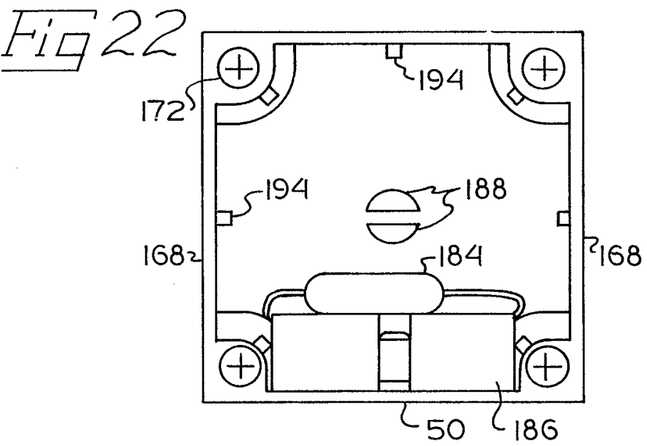
FIG. 22 is an end view of the sensing coil housing of FIG. 21 with the back wall thereof removed and the sensing coil mounted therewithin for side sensing.
Figure 23:
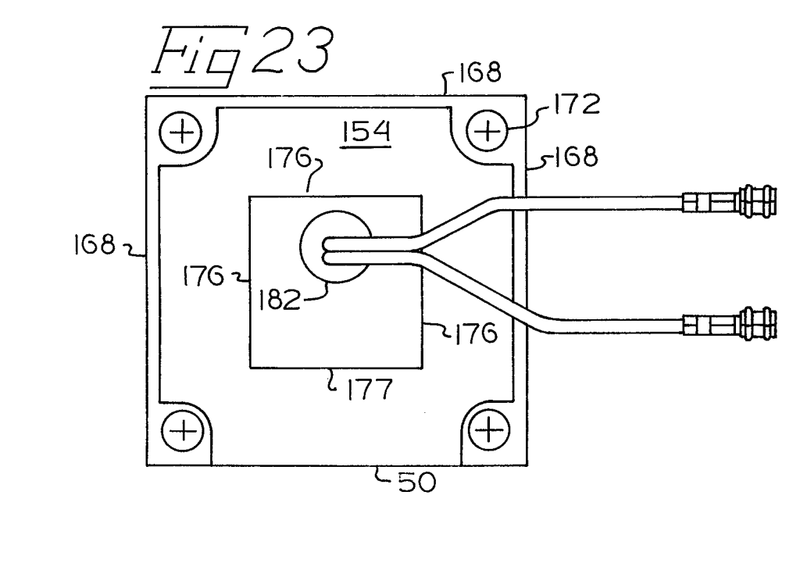
FIG. 23 is an end view of the sensing coil housing illustrating the cavity in the back mating wall thereof.
Figure 24:
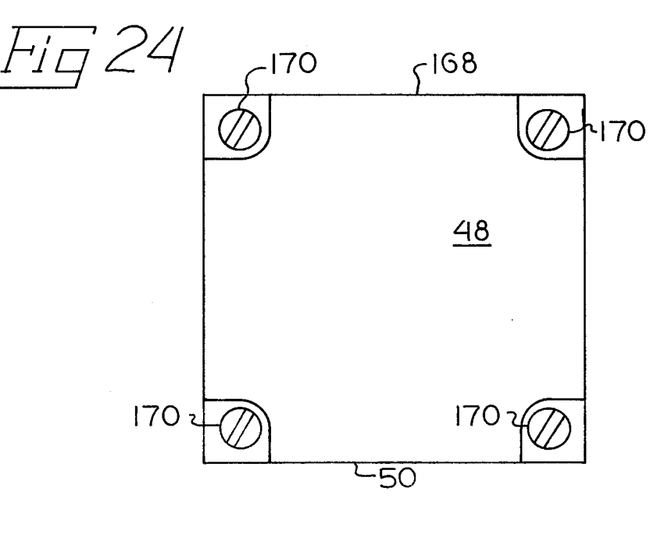
FIG. 24 is an end view of the sensing coil housing as viewed from the sensing end thereof.

Referring to FIGS. 21 and 22, the same housing shown in FIGS. 19 and 20 is also suitable for mounting the sensing coil against side wall 50 for side sensing. When mounted for side sensing, the bobbin 192 is held between side wall 50 and the one cavity-defining wall 177 parallel and adjacent thereto. A portion of bobbin 192 and capacitor 184 extend into the space occupied thereby when the bobbin 192 is mounted for end sensing.

The side walls 168, side wall 50 and end wall 48 are integrally formed with each other. The back wall 154 and the cavity-defining walls 176 and 177 are a separate integral structure. During assembly, the bobbin 192 is inserted into the body of the housing 46 for end sensing as shown in FIG. 20 or side sensing as shown in FIG. 22. Leads 180 are threaded through hole 182, and the back wall 154 is then secured to the ends of side walls 168 by a suitable adhesive. Recessed tabs 194, FIG. 22, support the back wall 154 intermediate the ends thereof at a level such that the exterior surface of back wall 154 is mounted flush with the end of side walls 168. The hole 182 is then filled with a suitable potting material (not shown) to seal housing 46 against moisture or the like.

We claim:

1. A housing and a circuit assembly for controlling a load connected through a lead therewith, comprising:
    a housing body defined by a top, bottom and a plurality of interconnected side walls, with a lead passage through one of said side walls, said top and bottom walls each having an opening, and an interior wall between the top and bottom wall openings having an inclined portion facing said lead passage and extending upwardly toward said top opening and having a terminal surface portion facing the opening in the top wall;
    an elongated conductive terminal member having one end received in and extending through the terminal surface of said interior wall adjacent said top opening and accessible therethrough;
    a circuit board with the elements of the control circuit thereon connected with the other end of said terminal and received within the bottom opening of said housing, said control circuit including a conductor on said circuit board contacting the other end of the terminal and electrically connecting a circuit element with the terminal; and
    means for electrically connecting an external lead with one of the circuit elements mounted on said circuit board, including means for connecting the lead to the accessible part of the conductive terminal member adjacent said top opening.

2. The housing and circuit assembly of claim 1 in which the terminal surface of said interior wall has a hole therethrough, said elongated terminal extending through the hole and snugly fitted therewithin.

3. The housing and circuit assembly of claim 2 wherein said housing body top wall has a viewing port, and said circuit assembly has an indicator light mounted to the circuit board and aligned with the viewing port.

4. The housing and circuit assembly of claim 1 in which one of the elements of the circuit is subject to heating during operation of the circuit and the other end of the conductive terminal member is in physical contact with said one circuit element to act as a heat sink therefor, said conductive terminal member conducting heat away from said one circuit element and to the accessible part of the terminal member.

5. The housing and circuit assembly of claim 1 in which the housing bottom wall is formed from a potting material the assembly including mating means holding the circuit board in a proper position relative to the housing body for the application of the potting material.

6. The housing and circuit assembly of claim 1 in which said terminal surface portion has a hole extending therethrough for snugly receiving said accessible part of the conductive terminal member, said hole and a surface on the conductive member preventing insertion of the accessible part thereof into the hole beyond a preselected point.

7. The housing and circuit assembly of claim 1 in which said conductive terminal member has a threaded hole at the accessible part thereof and the lead connecting means includes a threaded fastener screwed into the hole.

8. The housing and circuit assembly of claim 1 in which the conductive terminal member has a threaded hole in an end of the portion thereof within the housing and including a threaded fastener extending through the circuit board and into the hole.

9. The housing and circuit assembly of claim 1 including a second elongated conductive terminal member spaced from and parallel to the first mentioned elongated conductive terminal member, said second elongated conductive terminal member being secured to the housing body and having the circuit board mounted thereto in a substantially identical fashion as said first mentioned elongated conductive terminal member and being connected to a circuit element other than said circuit element, and means for connecting a second lead to the accessible part of the second terminal member.

10. A housing and sensing circuit assembly with positioning of a sensing element in one of a plurality of positions, comprising:
a circuit housing to be mounted in a sensing location;
a sensing element;
a sensing element housing defined by opposite back and end walls joined together by a plurality of interconnected side walls;
an interior wall parallel to one of the side walls, extending from the back wall toward the end wall, said interior wall being spaced from one side wall to hold the sensing element against the one side wall, said interior wall having an end spaced from the end wall a distance sufficient to allow mounting of the sensing element against the end wall and underlying the end of the interior wall; and
means for connecting said sensing element housing with said circuit housing, with the side walls of the sensing element housing in a selected orientation, whereby said sensing element may selectively be located in said sensing element housing either against said end wall or between said interior wall and said one side wall, and said sensing element housing may be connected with said circuit housing in a selected orientation to position said sensing element in a desired one of a plurality of positions with respect to said circuit housing.

11. The housing and sensing circuit assembly of claim 10 including means for holding the sensing element against the end wall.

12. The housing and sensing circuit assembly of claim 11 in which said sensing element has a body with a recess therein, and said holding means includes a pair of spaced tabs projecting from the end wall toward the back wall, said tabs snugly received within the recess and resiliently bearing against opposite sides thereof.

13. The housing and sensing circuit assembly of claim 10 in which the sensing element housing has two nonintegral parts, one of which includes the back wall and the interior wall.

14. The housing and sensing circuit assembly of claim 10 in which a cavity extends from the back wall toward the end wall, said cavity being defined in part by said interior wall.

15. The housing and sensing circuit assembly of claim 14 including a conductive member protruding through the housing at the cavity in the back wall and connected with the sensing element.

16. The housing and sensing circuit assembly of claim 10 in which said sensing element includes a coil.

17. A housing assembly and pair of complementary circuits, comprising:
a pair of housings enclosing the pair of cooperating circuits, said pair of housings having a pair of mating walls, both of said housings having cavities in the mating walls thereof;
means for securing the housings together with the mating walls in abutment and in a selected one of a plurality of orientations;
a rigid conductor connected with the circuit in one of said housings, extending into and entirely contained within and protected by the cavity in the mating wall of said one housing; and
a flexible conductor connected with the circuit in the other of said housings, protruding from the cavity in the mating wall of said other housing for connection with said rigid conductor, said flexible conductor being of sufficient length to enable separation of the mating walls and selection of the orientation therebetween, said flexible conductor being folded and contained within said cavities when said mating walls are in abutment.

18. The housing assembly and complementary circuits of claim 17 including means for providing a watertight seal around said cavity when the mating walls are in abutment.

* * * * *